US008426920B2

(12) United States Patent
Zhu et al.

(10) Patent No.: US 8,426,920 B2
(45) Date of Patent: Apr. 23, 2013

(54) MOSFET AND METHOD FOR MANUFACTURING THE SAME

(75) Inventors: Huilong Zhu, Poughkeepsie, NY (US); Qingqing Liang, Lagrangeville, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/379,111

(22) PCT Filed: Aug. 1, 2011

(86) PCT No.: PCT/CN2011/077864
§ 371 (c)(1),
(2), (4) Date: Dec. 19, 2011

(87) PCT Pub. No.: WO2013/000188
PCT Pub. Date: Jan. 3, 2013

(65) Prior Publication Data
US 2013/0001690 A1    Jan. 3, 2013

(30) Foreign Application Priority Data
Jun. 29, 2011    (CN) .......................... 2011 1 0178387

(51) Int. Cl.
*H01L 27/12*    (2006.01)
(52) U.S. Cl.
USPC ........... 257/347; 257/316; 257/354; 257/365; 257/366; 257/E29.275; 438/151; 438/197
(58) Field of Classification Search .................. 257/316, 257/347, 354, 365–366; 438/151, 197
See application file for complete search history.

(56) References Cited

U.S. PATENT DOCUMENTS 6,043,535 A * 3/2000 Houston ........................ 257/345
6,423,599 B1 * 7/2002 Yu ................................. 438/283
(Continued)

FOREIGN PATENT DOCUMENTS
CN          1830090 A       9/2006

OTHER PUBLICATIONS

International Search Report and Written Opinion for PCT Application No. PCT/CN2011/077864, dated Apr. 5, 2012, 13 pages.
(Continued)

*Primary Examiner* — Kyoung Lee
*Assistant Examiner* — Ankush Singal
(74) *Attorney, Agent, or Firm* — Westman, Champlin & Kelly, P.A.

(57) ABSTRACT

The present application provides a MOSFET and a method for manufacturing the same. The MOSFET comprises: a semiconductor substrate; a first buried insulating layer on the semiconductor substrate; a back gate formed in a first semiconductor layer which is on the first buried insulating layer; a second buried insulating layer on the first semiconductor layer; source/drain regions formed in a second semiconductor layer which is on the second buried insulating layer; a gate on the second semiconductor layer; and electrical contacts on the source/drain regions, the gate and the back gate, wherein the back gate is only under a channel region and one of the source/drain regions and not under the other of the source/drain regions, and a common electrical contact is formed between the back gate and the one of the source/drain regions. The MOSFET improves an effect of suppressing short channel effects by an asymmetric back gate, and reduces a footprint on a wafer by using the common conductive via.

15 Claims, 6 Drawing Sheets

U.S. PATENT DOCUMENTS

| | | | |
|---|---|---|---|
| 6,538,916 B2 * | 3/2003 | Ohsawa | 365/149 |
| 6,815,296 B2 * | 11/2004 | Dennard et al. | 438/283 |
| 6,953,726 B2 * | 10/2005 | Nowak et al. | 438/268 |
| 7,033,913 B2 * | 4/2006 | Usuda et al. | 438/459 |
| 7,115,965 B2 * | 10/2006 | Ho et al. | 257/526 |
| 7,638,845 B2 * | 12/2009 | Kato | 257/349 |
| 7,973,364 B2 * | 7/2011 | Krivokapic | 257/347 |
| 2002/0105039 A1 * | 8/2002 | Hanafi et al. | 257/401 |
| 2004/0061148 A1 * | 4/2004 | Hsu | 257/239 |
| 2005/0104130 A1 * | 5/2005 | Nowak et al. | 257/368 |
| 2006/0125011 A1 * | 6/2006 | Chang | 257/347 |
| 2006/0231873 A1 | 10/2006 | Anderson et al. | |
| 2007/0128820 A1 * | 6/2007 | Majumdar et al. | 438/369 |
| 2007/0187769 A1 * | 8/2007 | Anderson et al. | 257/369 |
| 2008/0258221 A1 * | 10/2008 | Dennard et al. | 257/350 |
| 2009/0212362 A1 * | 8/2009 | Cheng et al. | 257/347 |
| 2010/0176453 A1 | 7/2010 | Dennard et al. | |
| 2011/0042746 A1 * | 2/2011 | Tak et al. | 257/348 |
| 2011/0108942 A1 | 5/2011 | Fenouillet-Beranger et al. | |
| 2011/0127608 A1 * | 6/2011 | Cheng et al. | 257/347 |
| 2011/0187412 A1 * | 8/2011 | Ma et al. | 326/112 |
| 2011/0316083 A1 * | 12/2011 | Cheng et al. | 257/365 |
| 2012/0032270 A1 * | 2/2012 | Okumura et al. | 257/368 |
| 2012/0104495 A1 * | 5/2012 | Zhu et al. | 257/347 |
| 2012/0146147 A1 * | 6/2012 | Hook | 257/351 |
| 2012/0225525 A1 * | 9/2012 | Bangsaruntip et al. | 438/151 |
| 2012/0241902 A1 * | 9/2012 | Cheng et al. | 257/506 |
| 2012/0256260 A1 * | 10/2012 | Cheng et al. | 257/347 |

OTHER PUBLICATIONS

Yan et al., "Scaling the Si MOSFET: From Bulk to SOI to Bult", IEEE Transactions of Electron Devices, vol. 39, No. 7, Jul. 1992, pp. 1704-1710 (7 pages total).

* cited by examiner

MOSFET AND METHOD FOR MANUFACTURING THE SAME

CROSS-REFERENCE TO RELATED APPLICATION

This application is a National Phase application of, and claims priority to, No. PCT/CN2011/077864, filed on Aug. 1, 2011, claims priority to the Chinese Patent Application No. 201110178387.6, filed on Jun. 29, 2011, entitled "MOSFET AND METHOD FOR MANUFACTURING THE SAME", both the PCT Application and Chinese Application are incorporated herein by reference in their entireties.

TECHNICAL FIELD

The present disclosure relates to a MOSFET and a method for manufacturing the same, and in particular, to a MOSFET with a back gate and a method for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases. As the MOSFETs are scaled down, a gate also has a reduced effective length and actually controls fewer charges in a depletion region when a gate voltage is applied. Consequently, a threshold voltage of the MOSFETs drops with a reduced channel length.

It is disclosed in "Scaling the Si MOSFET: From bulk to SOI to bulk", Yan et al., IEEE Trans. Elect. Dev., Vol. 39, p. 1704, June, 1992, that a ground plane (i. e., a backgate being grounded) can be arranged below a buried oxide layer for suppressing short channel effects in an SOI MOSFET.

However, the above-mentioned SOI MOSFET with the back gate must be grounded or biased to a predetermined potential during operations. For this, an additional chip area is required for providing electrical contacts with the back gate, for example, to form additional vias and wirings.

Therefore, it is still desirable to provide a back gate in a MOSFET while reducing a footprint on a wafer.

SUMMARY OF THE DISCLOSURE

The object of the present disclosure is to provide a MOSFET which suppresses short channel effects with a back gate and which has a slightly increased footprint on a wafer.

According to one aspect of the present disclosure, there is provided a method for manufacturing a MOSFET, comprising: providing an SOI wafer comprising a semiconductor substrate, a first buried insulating layer, a first semiconductor layer, a second buried insulating layer and a second semiconductor layer, from bottom to top; forming a back gate in the first semiconductor layer; forming source/drain regions in the second semiconductor layer; forming a gate on the second semiconductor layer; land providing electrical contacts on the source/drain regions, the gate and the back gate, wherein the back gate is only under a channel region and one of the source/drain regions and not under the other of the source/drain regions, and the back gate and the one of the source/drain regions share a common electrical contact.

According to another aspect of the present disclosure, there is provided a MOSFET, comprising: a semiconductor substrate; a first buried insulating layer on the semiconductor substrate; a back gate formed in a first semiconductor layer which is on the first buried insulating layer; a second buried insulating layer on the first semiconductor layer; source/drain regions formed in a second semiconductor layer which is on the second buried insulating layer; a gate on the second semiconductor layer; and electrical contacts on the source/drain regions, the gate and the back gate, wherein the back gate is only under a channel region and one of the source/drain regions and not under the other of the source/drain regions, and a common electrical contact is formed between the back gate and the one of the source/drain regions.

In the MOSFET according to the present disclosure, a back gate is formed with a semiconductor layer, and a buried insulating layer serves as a gate dielectric layer for the back gate. The back gate is only under a channel region and one of source/drain regions and not under the other of the source/drain regions.

When applying a control voltage to the back gate, the resultant electric field is applied to the channel region through the buried insulating layer. A threshold voltage is adjusted by capacitive coupling. Due to the asymmetric back gate, the voltage applied to the whole channel by the back gate is non-uniform. It thus improves the effect for suppressing the short channel effects.

A threshold voltage of the semiconductor device can be adjusted by changing a doping type of the back gate. For example, the dopant can have a type opposite to the conductivity type of the MOSFET for suppressing the short channel effects.

Moreover, a common electrical contact is formed between the back gate and an active region. Therefore, the back gate does not increase a footprint of the MOSFET on a wafer significantly.

DETAILED DESCRIPTION

Figure 1:
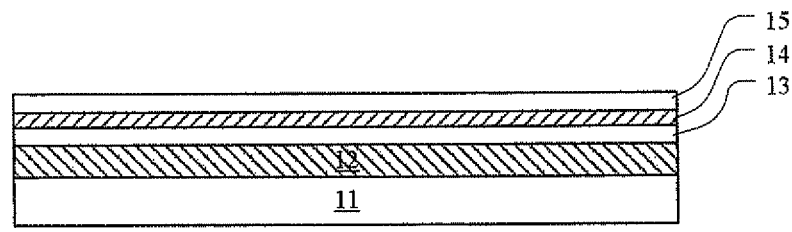
FIGS. 1-11 schematically show cross-sectional views of the semiconductor structure at various stages of the method for manufacturing an ultra-thin MOSFET according to the present disclosure.

Exemplary embodiments of the present disclosure will be described in more details below with reference to the accompanying drawings. In the drawings, like reference numerals denote like members. The figures are not drawn to scale, for the sake of clarity.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure. Unless the context clearly indicates otherwise, each part of the semiconductor device can be made of material(s) well known to one skilled person in the art.

In the present application, the term "semiconductor structure" means generally the whole semiconductor structure formed at each step of the method for manufacturing the semiconductor device, including a semiconductor substrate and all of the layers and regions having been formed on the semiconductor substrate.

According to one preferable embodiment according to the present disclosure, the steps shown in FIGS. 1 to 11 are performed in sequence for manufacturing an ultra-thin SOI MOSFET.

As shown in FIG. 1, an SOI wafer is used as an initial structure of the semiconductor substrate, which comprises a semiconductor substrate 11, a first buried insulating layer 12, a first semiconductor layer 13, a second buried insulating layer 14 and a second semiconductor layer 15, from bottom to top. The first buried insulating layer 12 may have a thickness of about 20-100 nm, the first semiconductor layer 13 may have a thickness of about 10-100 nm, the second buried insulating layer 14 may have a thickness of about 5-30 nm, and the second semiconductor layer 15 may have a thickness of about 5-20 nm. For example, the first buried insulating layer 12 and the second buried insulating layer 14 may be an oxide buried layer.

The first semiconductor layer 13 and the second semiconductor layer 15 may be made of a material selected from Group IV semiconductor materials (such as Si or Ge) or Group III-V semiconductor materials (such as, gallium arsenide), for example, single crystal silicon or SiGe. For example, the first buried insulating layer 12 and the second buried insulating layer 14 may be made of oxides or nitrides, for example, $SiO_2$.

the final MOSFET, the first semiconductor layer 13 is used for providing a back gate of the MOSFET, the second buried insulating layer 14 is used for providing a back gate dielectric layer, and the first buried insulating layer 12 is used for electrically isolating the back gate from the semiconductor substrate. The second semiconductor layer 15 will be used for providing a channel region and a portion of source/drain regions.

The process for providing an SOI wafer is well known in the art. For example, SmartCut™ process (referred to as "Smart Cut" or "Smart Strip") can be used for this purpose. The SmartCut™ process comprises the steps of bonding two wafers with each other, each of which has a surface oxide layer formed by thermal oxidation or deposition, and one of which is subjected to hydrogen implantation so as to form a hydrogen implantation region at a predetermined depth in the silicon body below the surface oxide layer; converting the hydrogen implantation region to a layer having micro-cavities under the conditions of an increased pressure and an increased temperature; and separating one of the two wafers from the other of the two wafers. The other of the two wafers is used as an SOI wafer. By controlling process parameters in the thermal oxidation or in the deposition, a thickness of the buried oxide layer in the SOI wafer can be changed. By controlling implantation energy during the hydrogen implantation, a thickness of the top semiconductor layer in the SOI wafer can be varied.

As an example, an SOI wafer shown in FIG. 1 can be obtained by performing above-mentioned steps of wafer bonding, hydrogen implantation and layer separation twice.

Figure 2:
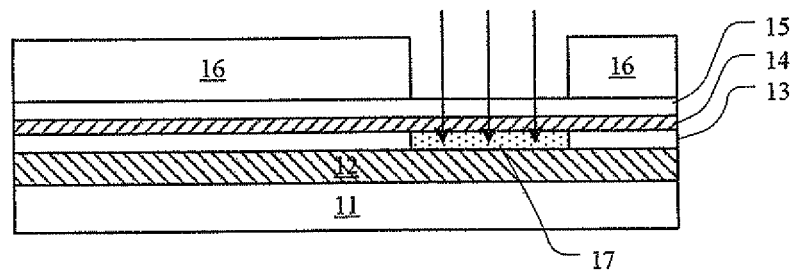

Next, a photoresist layer is formed on the second semiconductor layer 15. The photoresist layer is exposed and developed to form a photoresist mask 16 with a pattern. The photoresist mask 16 comprises an opening which is approximately aligned with one of the source/drain regions (at right side of FIG. 2). A first ion implantation is performed using the photoresist mask 16, such that implanted ions pass through the opening in the photoresist mask 16, penetrate the second semiconductor layer 15 and the second buried insulating layer 14 from top to bottom, and reach and are distributed in the first semiconductor layer 13 to form a sacrificial implantation region 17, as shown in FIG. 2. It is known for those skilled in the art that a depth of the ion implantation can be controlled by adjusting energy for the ion implantation.

An N-type dopant is used in the first ion implantation, for example, arsenic (As), phosphor (P) or a combination thereof. The sacrificial implantation region 17 is an N-type heavily doped region, for example, with a doping concentration higher than $10^{18}$ cm$^{-3}$.

Figure 3:
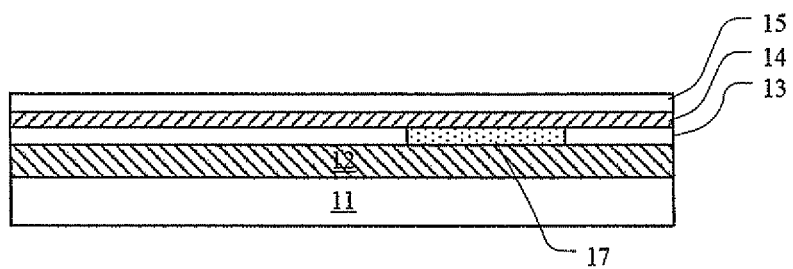

Next, the photoresist mask 16 is removed by dissolution in a solvent or ashing, and an annealing treatment is performed to activate the dopant, as shown in FIG. 3.

Next, by a conventional deposition process, a pad oxide layer 18 with a thickness of about 5-10 nm is formed on the second semiconductor layer 15, and a nitride layer 19 with a thickness of about 50-120 nm is formed on the pad oxide layer 18.

Figure 4:
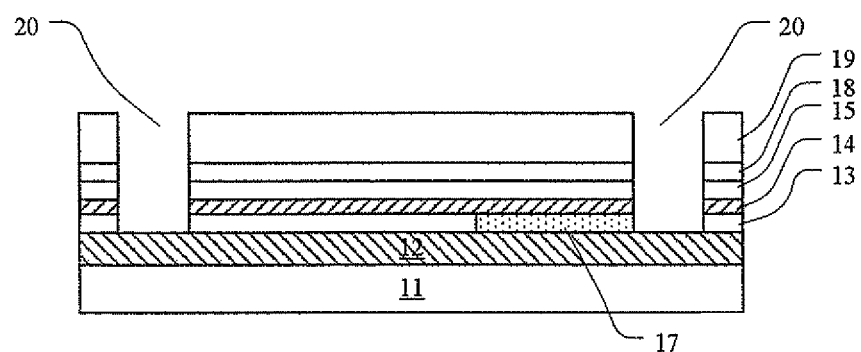

Two shallow trench isolation (STI) openings 20 are formed by patterning in the first semiconductor layer 13, the second buried insulating layer 14, the second semiconductor layer 15, the pad oxide layer 18 and the nitride layer 19. The shallow trench isolation (STI) openings 20 are used for defining an active region of the MOSFET. One shallow trench isolation opening 20 at right side of the figure exposes one side surface of the sacrificial implantation region 17, as shown in FIG. 4. This active region comprises the sacrificial implantation region 17 and a portion of the first semiconductor layer 13.

The patterning process may involve the following steps: a photoresist mask with a pattern is formed on the nitride layer 19, by a conventional lithographical process including exposure and development steps; the exposed portions of the nitride layer 19, the pad oxide layer 18, the second semiconductor layer 15, the second buried insulating layer 14, the first semiconductor layer 13 are removed by dry etching such as ion beam milling, plasma etching, reactive ion etching, laser ablation and the like, or wet etching using a solution of etchant, stopping on the top of the first buried insulating layer 12; and the photoresist mask is then removed by dissolution in a solvent or ashing.

Next, the N-type sacrificial implantation region 17 is selectively removed with respect to the undoped portion of the first semiconductor layer 13, through the shallow trench isolation openings 20. An opening, which communicates o with the shallow trench isolation opening 20 at right side of the figure and extending : laterally under the second buried insulating layer 14, is thus formed. For example, .: in the case where the first semiconductor layer 13 is made of Si, the etchant used for removing the N-type sacrificial implantation region 17 is $HC_2H_3O_2:HNO_3:HF$.

Figure 5:
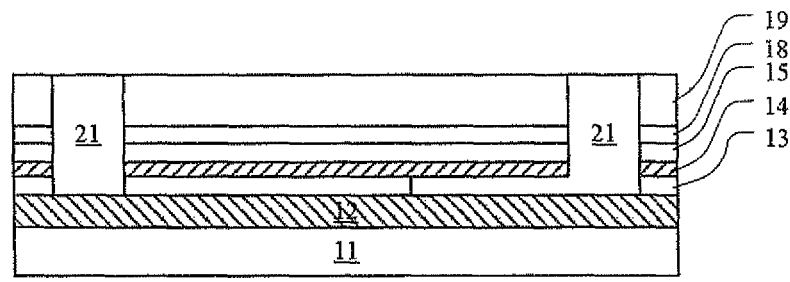

Next, an oxide layer is formed on .the whole surface of the semiconductor structure by the above-mentioned conventional deposition process. The oxide layer fills up the shallow trench isolation opening 20. After that, with the nitride layer 19 as a stop layer, chemical-mechanical polishing (CMP) is performed on the oxide layer to form an oxide 21, as shown in FIG. 5. At right side of the figure, the oxide 21 comprises a portion thereof extending laterally under the second buried insulating layer 14.

Figure 6:
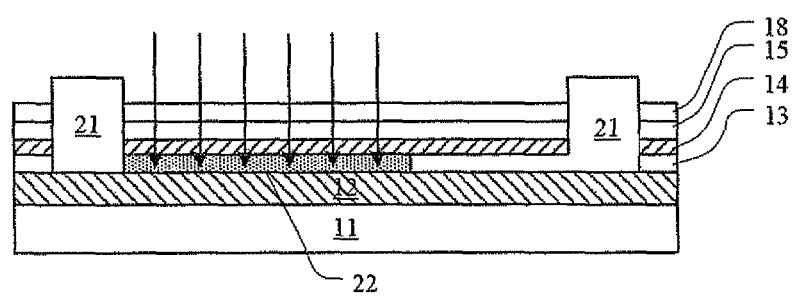

Next, the oxide 21 is etched back. The nitride layer 19 is then completely removed by etching. A second ion implantation is performed to form a back gate 22 in the first semiconductor layer 13, as shown in FIG. 6. The back gate 22 is self-aligned with the oxide 21.

The type of the dopant used in the second ion implantation depends on the type of the MOSFET and the expected adjustment effect for the threshold voltage. If the dopant type is opposite to the conductivity type of the MOSFET, the threshold voltage of the device will be increased. On the contrary, if the dopant type is the same as the conductivity type of the MOSFET, the threshold voltage of the device will be reduced.

The doping concentration used in the second ion implantation may be about $10^{17}$-$10^{20}$ cm$^{-3}$.

Figure 7:
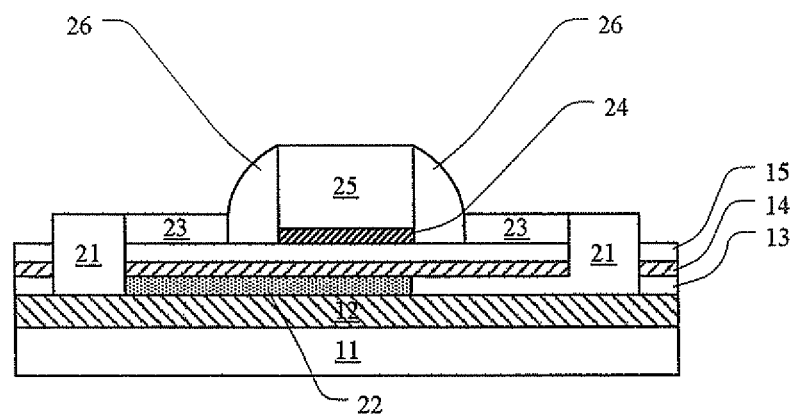

Next, the pad oxide layer 18 is removed by dry etching or wet etching which stops at the top surface of the second semiconductor layer 15. After that, a third semiconductor layer 23 is epitaxially grown on the second semiconductor layer 15 to form raised source/drain regions. A gate stack and sidewall spacers 26 surrounding the gate stack are formed on the second semiconductor layer 15 between the source/drain regions, as shown in FIG. 7.

The gate stack comprises a gate dielectric layer 24 having a thickness of about 1-4 nm and a gate conductor 25 having a thickness of about 30-100 nm.

The gate conductor 25 is typically patterned into strips. Deposition process and patterning process for forming the gate stack are well known.

The gate dielectric layer 24 is made of one selected from the group consisting of oxides, oxynitrides, high K and their combinations. The gate conductor 25 can be for example a metal layer, a doped polysilicon layer, or a multilayer gate conductor including a metal layer and a doped polysilicon layer.

After forming sidewall spacers, a source/drain implantation is performed in the portions of the second semiconductor layer 15 and the third semiconductor layer 23 on both sides of the gate stack, to form source/drain regions. Preferably, the source/drain regions are formed in self-aligned manner. A spike annealing treatment is performed at a temperature of 900-1100° C. to activate impurities in the source/drain regions.

Preferably, source/drain extensions and halos are also formed. To form the source/drain extensions, an ion implantation of As or P is performed for an N-type MOSFET, and an ion implantation of B, BF2 or In is performed for a P-type MOSFET. To form the source/drain halos, an ion implantation of B, BF2 or In is performed for an N-type MOSFET, and an ion implantation of As or P is performed for a P-type MOSFET.

Next, a portion of the oxide 21 in the shallow trench isolation openings is removed by anisotropic dry etching or wet etching. Shallow trench isolation openings 27 are thus formed again. A portion of the oxide 21 extending laterally under the second buried insulating layer 14 remains in anisotropic etching.

Moreover, one side surface of the back gate 22 is exposed in a shallow trench isolation opening 27 at left side in the figure, and one side surface of the oxide 21 is exposed in a shallow trench isolation opening 27 at right side in the figure. The other side surface of the back gate 22 and the other side surface of the oxide 21 adjoin with each other. The asymmetric back gate 22 is only under the channel region and one of the source/drain regions and not under the other of the source/drain regions.

Figure 8:
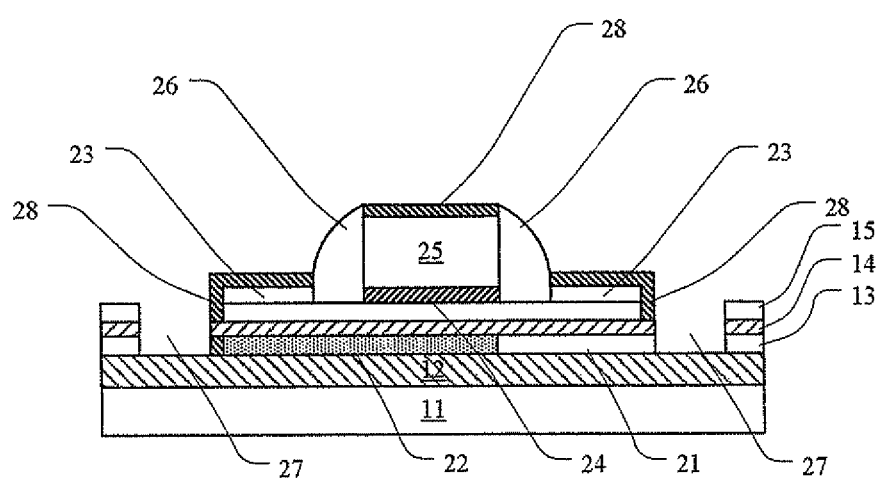

Next, a silicidation process is performed to form a silicide 28 at the top surface of the gate conductor 25, at the top surface of the source/drain regions, at side surfaces of the source/drain regions away from the channel region, and at the side surface of the back gate 22 away from the channel region, as shown in FIG. 8.

The silicidation process is well known, for example, comprising the steps of conformally forming an Ni layer and a Pt layer in sequence by the above-mentioned deposition process; performing an annealing treatment at a temperature of about 300-500° C. so that the deposited Ni and Si react with each other to form NiPtSi; and finally, selectively removing the un-reacted Ni and Pt with respect to the silicide by wet etching.

Figure 9:
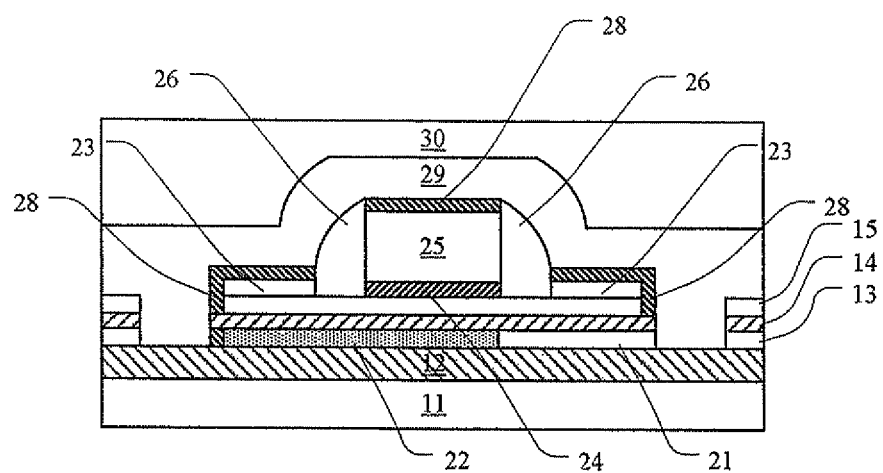

Next, a nitride layer 29 with a thickness of about 30-100 nm and an oxide layer 30 with a thickness of about 50-300 nm are formed on the whole semiconductor structure in sequence by a conventional CMOS process. Next, chemical-mechanical polishing is performed to obtain a planar structure surface, as shown in FIG. 9. The nitride layer 29 and the oxide layer 30 are used together as an inter-layer dielectric layer. Also, the nitride layer 29 fills up the shallow trench isolation openings 27 to serve as the shallow trench isolations.

Figure 10:
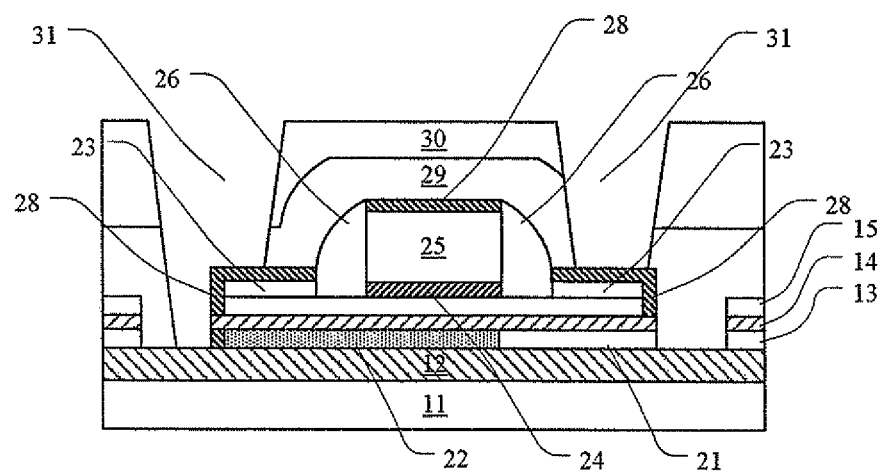
Figure 11:
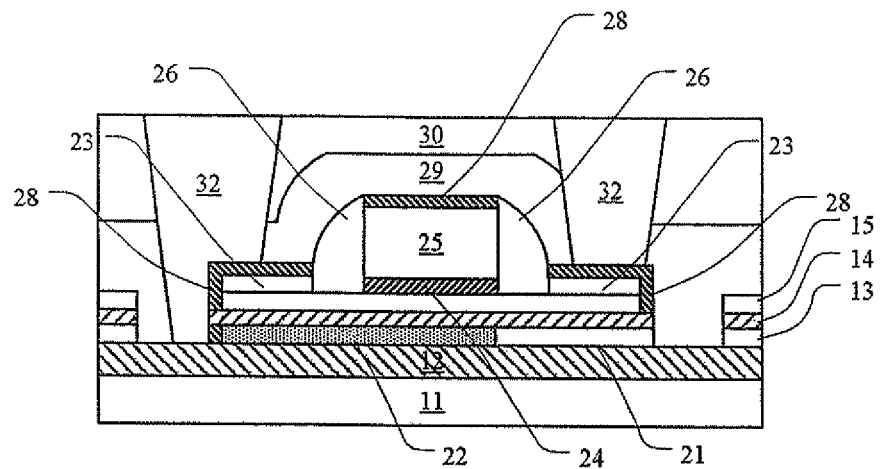

Next, using a photoresist mask with a pattern (not shown), contact holes 31, which reach the source region, the drain region and the back gate 22, are formed by dry etching or wet etching (as shown in FIG. 10). Conductive vias 32 are formed by filling the contact holes 31 with a conductive material, and removing the portions of the conductive material outside of the contact holes 31 (as shown in Fig. 11). The conductive material can be but not limited to Cu, Al, W, polysilicon and other similar conductive materials.

Preferably, a liner layer with a thickness of about 1-10 nm (not shown) may be formed on inner walls of the contact holes 31 by the above-mentioned conventional deposition; process. The material of the liner layer may be, but not limited to, one of Ta, TaN, Ti, TiN and Ru, or any combination thereof.

Figure 12:
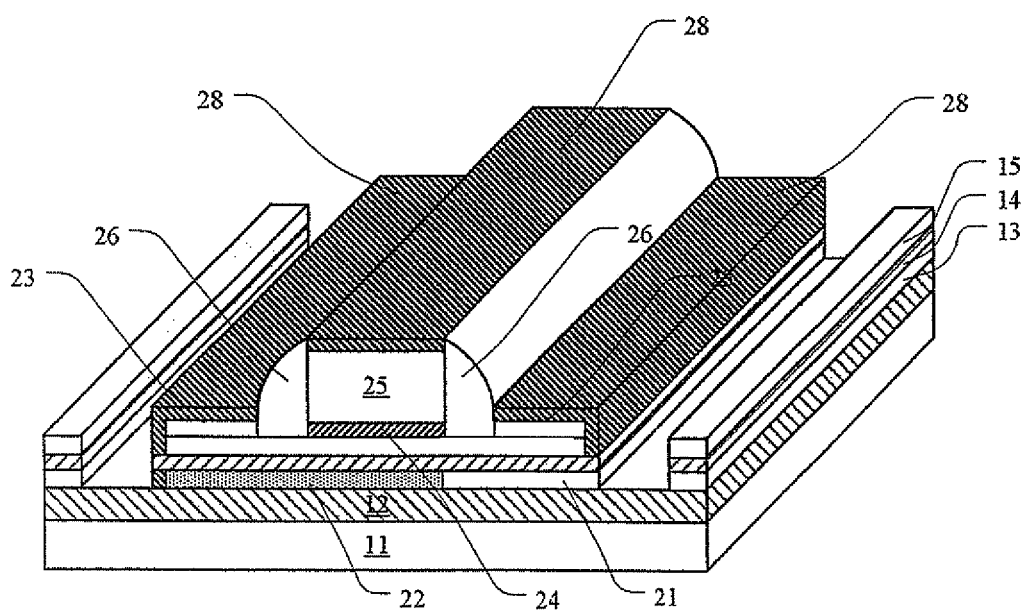
FIG. 12 schematically shows a perspective view of an ultra-thin MOSFET according to the present disclosure.

FIG. 12 schematically shows a perspective view of an ultra thin MOSFET according to the present disclosure, in which an inter-layer dielectric layer (i.e. the nitride layer 29 and the oxide layer 30 shown in FIG. 11) and conductive vias (i.e. the conductive vias 32 shown in FIG. 11) are not shown. In a MOSFET according to the present disclosure, a first semiconductor layer 13 forms a back gate of the MOSFET, a second buried insulating layer 14 serves as a gate dielectric layer of the back gate, and a second semiconductor layer 15 forms a channel region and a portion of source/drain regions of the MOSFET. A first buried insulating layer 12 is used for electrically isolating the back gate from a semiconductor substrate. The back gate is only under a channel region and one of source/drain regions and not under the other of the source/drain regions. A common conductive via is used to provide electrical connections to the back gate and the one of the source/drain regions.

While the disclosure has been described with reference to specific embodiments, the description is illustrative of the disclosure. The description is not to be considered as limiting the disclosure. Various modifications and applications may occur for those skilled in the art without departing from the true spirit and scope of the disclosure as defined by the appended claims.

We claim:

1. A method for manufacturing a MOSFET, comprising:
   providing an SOI wafer comprising a semiconductor substrate, a first buried insulating layer, a first semiconductor layer, a second buried insulating layer and a second semiconductor layer, from bottom to top;
   forming a back gate in the first semiconductor layer;
   forming source/drain regions in the second semiconductor layer;
   forming a gate on the second semiconductor layer; and
   providing electrical contacts on the source/drain regions, the gate and the back gate,
   wherein the back gate is only under a channel region and one of the source/drain regions and not under the other of the source/drain regions, and the back gate and the one of the source/drain regions share a common electrical contact.

2. The method according to claim 1, wherein the step of providing electrical contacts comprises:
performing a silicidation process to form a silicide at the top surface of the gate, at the top surface of the source/drain regions, at side surfaces of the source/drain regions away from the channel region, and at the side surface of the back gate away from the channel region, wherein the common electrical contact is in contact with the silicide.

3. The method according to claim 1, wherein the step of forming the back gate comprises:
filling an oxide in the first semiconductor layer; and
forming the back gate which is self-aligned with the filled oxide in the first semiconductor layer.

4. The method according to claim 1, wherein the step of forming source/drain regions comprises:
epitaxially growing a third semiconductor layer on the second semiconductor layer; and
performing a source/drain implantation in the second semiconductor layer and the third semiconductor layer to form raised source/drain regions.

5. The method according to claim 3, wherein the step of filling an oxide in the first semiconductor layer comprises:
performing a first ion implantation to form a sacrificial implantation region in a portion of the first semiconductor layer;
forming shallow trench isolation openings which define an active region comprising the sacrificial implantation region and an undoped portion of the first semiconductor layer and exposing one side surface of the sacrificial implantation region;
selectively removing the sacrificial implantation region with respect to the undoped portion of the first semiconductor layer by etching through the shallow trench isolation openings; and
forming the oxide which fills up the shallow trench isolation openings and extends under the second buried insulating layer.

6. The method according to claim 5, wherein the step of forming the back gate which is self-aligned with the oxide in the first semiconductor layer comprises:
performing a second ion implantation to form the back gate in the undoped portion of the first semiconductor layer.

7. The method according to claim 5, wherein the sacrificial implantation region is an N-type heavily doped region.

8. The method according to claim 6, wherein the type of dopants used in the second ion implantation is opposite to the conductivity type of the MOSFET.

9. The method according to claim 6, wherein the type of dopants used in the second ion implantation is the same as the conductivity type of the MOSFET.

10. The method according to claim 7, wherein the first semiconductor layer is made of Si, and the etchant used in the step of removing the sacrificial implantation region by etching is $HC_2H_3O_2:HNO_3:HF$.

11. A MOSFET, comprising:
a semiconductor substrate;
a first buried insulating layer on the semiconductor substrate;
a back gate formed in a first semiconductor layer which is on the first buried insulating layer;
a second buried insulating layer on the first semiconductor layer;
source/drain regions formed in a second semiconductor layer which is on the second buried insulating layer;
a gate on the second semiconductor layer; and
electrical contacts on the source/drain regions, the gate and the back gate,
wherein the back gate is only under a channel region and one of the source/drain regions and not under the other of the source/drain regions, and a common electrical contact is formed between the back gate and the one of the source/drain regions.

12. The MOSFET according to claim 11, further comprising a silicide at the top surface of the gate, at the top surface of the source/drain regions, at side surfaces of the source/drain regions away from the channel region, and at the side surface of the back gate away from the channel region, wherein the common electrical contact is in contact with the silicide.

13. The MOSFET according to claim 11, wherein the type of the dopants in the back gate is opposite to the conductivity type of the MOSFET.

14. The MOSFET according to claim 11, wherein the type of the dopants in the back gate is the same as the conductivity type of the MOSFET.

15. The MOSFET according to claim 11, further comprising a third semiconductor layer epitaxially grown on the second semiconductor layer, wherein the source/drain regions are raised source/drain regions formed in the second semiconductor layer and the third semiconductor layer.

* * * * *